United States Patent

Fujikawa

(10) Patent No.: US 8,624,303 B2
(45) Date of Patent: Jan. 7, 2014

(54) FIELD EFFECT TRANSISTOR

(75) Inventor: Kazuhiro Fujikawa, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 81 days.

(21) Appl. No.: 13/377,122

(22) PCT Filed: Oct. 20, 2010

(86) PCT No.: PCT/JP2010/068437
§ 371 (c)(1),
(2), (4) Date: Dec. 8, 2011

(87) PCT Pub. No.: WO2011/121830
PCT Pub. Date: Oct. 6, 2011

(65) Prior Publication Data
US 2012/0080729 A1     Apr. 5, 2012

(30) Foreign Application Priority Data

Mar. 29, 2010 (JP) ................ 2010-075375

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl.
USPC ............................ 257/288; 257/77; 257/192

(58) Field of Classification Search
USPC .................. 257/77, 192, 288, E29.255
See application file for complete search history.

(56) References Cited

U.S. PATENT DOCUMENTS

| | | | |
|---|---|---|---|
| 6,426,525 B1 | 7/2002 | Brindle | |
| 7,023,033 B2 | 4/2006 | Harada et al. | |
| 7,528,426 B2 | 5/2009 | Harada et al. | |
| 2003/0168704 A1 | 9/2003 | Harada et al. | |
| 2006/0118813 A1 | 6/2006 | Harada et al. | |
| 2008/0157222 A1* | 7/2008 | Wang | 257/401 |
| 2009/0050900 A1* | 2/2009 | Masuda | 257/77 |
| 2009/0189205 A1* | 7/2009 | Ohki | 257/288 |

FOREIGN PATENT DOCUMENTS

| | | |
|---|---|---|
| JP | 4-302149 A | 10/1992 |
| JP | 11-121468 A | 4/1999 |
| JP | 11-307552 A | 11/1999 |
| JP | 2000-332234 A | 11/2000 |
| JP | 2002-373986 A | 12/2002 |

(Continued)

OTHER PUBLICATIONS

Notice of Grounds of Rejection in Japanese Patent Application No. 2010-075375, dated Apr. 23, 2013.

*Primary Examiner* — Phuc Dang
(74) *Attorney, Agent, or Firm* — Venable LLP; Michael A. Sartori; Tamatane J. Aga

(57) ABSTRACT

A lateral field-effect transistor capable of improving switching speed and reducing operationally defective products is provided. A gate wiring has a base, a plurality of fingers protruding from the base, and a connection connecting tips of adjacent fingers. The finger of the gate wiring is arranged between the finger of a source wiring and the finger of a drain wiring. The base of the gate wiring is arranged between the base of the source wiring and the fingers of the drain wiring and intersects with the fingers of the source wiring, with an insulating film interposed between the base of the gate wiring and the fingers.

9 Claims, 7 Drawing Sheets

(56) References Cited

FOREIGN PATENT DOCUMENTS

| JP | 2003-068762 A | 3/2003 |
|---|---|---|
| JP | 2006-066887 A | 3/2006 |
| JP | 2006-120952 A | 5/2006 |
| JP | 2009-054632 A | 3/2009 |
| JP | 2009-212458 A | 9/2009 |
| WO | WO-2006/065324 A2 | 6/2006 |

* cited by examiner

FIELD EFFECT TRANSISTOR

TECHNICAL FIELD

The present invention relates to a field effect transistor, in particular to a lateral field-effect transistor.

BACKGROUND ART

As to a lateral field-effect transistor, if an enlarged gate width is used to increase current capacity, a comb-shaped structure is often employed for source wiring and for drain wiring so that a plurality of transistor cells can be disposed to be connected in parallel. In such a case, as for gate wiring, a meander shape or a comb shape is employed.

A conventionally proposed field effect transistor has a top surface pattern formed in such a shape that digitiform portions of comb-shaped source and drain electrodes are disposed in opposed positions to interdigitate with each other, and a meander-shaped gate electrode is located between the source electrode and the drain electrode. Another conventionally proposed field effect transistor has digitiform portions of comb-shaped source and drain electrodes formed in an opposing manner to interdigitate with each other, digitiform portions of a comb-shaped gate electrode formed between the source electrode and the drain electrode, and common sections to serve as bases of the digitiform portions of the gate electrode and formed external to the transistor (for example, see Japanese Patent Laying-Open No. 2006-066887 (Patent Literature 1)).

A still another conventionally proposed transistor has a plurality of unit cells each having a source contact and a drain contact which are interdigitated, a gate contact situated between the source contact and the drain contact, and an overlayer electrically coupling the source contact to a p+ region via a p+ contact which is disposed in a contact via hole (for example, see International Publication No. WO 2006/065324 (Patent Literature 2)).

CITATION LIST

Patent Literature

PTL 1: Japanese Patent Laying-Open No. 2006-066887
PTL 2: International Publication No. WO 2006/065324

SUMMARY OF INVENTION

Technical Problem

Generally, it is understood that on the meander-shaped gate electrode disclosed in the document above, there is a gate wiring which is in the same meander shape as that of the gate electrode and has one end connected to a gate pad. If the gate wiring is in a meander shape, the gate wiring has a high resistance, and charging/discharging of a gate circuit takes time. In addition, the gate wiring has a longer length, which causes a time lag in a gate voltage change between a section of the gate wiring near the gate pad and another section distant from the gate pad. For these reasons, switching of the transistor cannot be speeded up.

Further, generally, the gate wiring has a width on the order of not more than 1 μm. Thus, during a manufacturing process, a missing pattern may occur, where wiring is partially not formed due to a failure in photolithography. If the gate wiring is in a meander shape, when the gate wiring breaks at even one point, a gate voltage does not change in a section of the gate wiring more distant from the gate pad than the point, and the transistor does not operate in that section. For this reason, an operationally defective transistor product tends to be produced.

Now, the comb-shaped gate wiring disclosed in the above-indicated Japanese Patent Laying-Open No. 2006-066887 (Patent Literature 1) has the digitiform portions of the gate wiring which run below the base of the source wiring. Usually, the base of the source wiring takes a large width, and therefore, the gate wiring running therebelow has a longer length and a higher resistance. Further, the gate wiring and the base of the source wiring have a larger intersecting area between them, which results in a larger gate-to-source capacity. For these reasons, charging/discharging of a gate circuit takes time, and switching of the transistor cannot be speeded up. In addition, due to a missing pattern occurred during a manufacturing process, the digitiform portions of the gate wiring break, the transistor does not operate in a section beyond the broken point, and an operationally defective transistor product tends to be produced.

The present invention has been made in view of the problems above, and an object of the invention is to provide a lateral field-effect transistor capable of improving switching speed and reducing operationally defective products.

Solution to Problem

A field effect transistor according to the present invention includes a substrate, an active layer formed on the substrate and a source wiring, a drain wiring and a gate wiring formed above the active layer. The source wiring is formed in a comb shape having a source wiring base and a plurality of source wiring fingers protruding from the source wiring base. The drain wiring is formed in a comb shape having a drain wiring base and a plurality of drain wiring fingers protruding from the drain wiring base. The source wiring and the drain wiring are arranged to oppose each other such that the source wiring fingers and the drain wiring fingers interdigitate. The gate wiring has a gate wiring base, a plurality of gate wiring fingers protruding from the gate wiring base, and a connection connecting tips of adjacent gate wiring fingers. The gate wiring finger is arranged between the source wiring finger and the drain wiring finger, and the gate wiring base is arranged between the source wiring base and the drain wiring fingers and intersects with the source wiring fingers, with an insulating film interposed between the gate wiring base and the source wiring fingers.

Preferably, adjacent gate wiring fingers and the connection connecting the gate wiring fingers make up a first wiring. A section of the gate wiring base between two points where adjacent gate wiring fingers connected by the connection are connected to the gate wiring base, respectively, makes up a second wiring which is electrically parallel with the first wiring. The first wiring has an electrical resistance not less than the electrical resistance of the second wiring.

Preferably, the gate wiring finger has a vertical cross-sectional area not more than the vertical cross-sectional area of the gate wiring base.

Preferably, the active layer includes a first conductivity type buffer layer, a second conductivity type channel layer formed on the buffer layer and having a surface, a second conductivity type source region formed from the surface of the channel layer opposing at least part of the source wiring finger to an interior of the channel layer, a second conductivity type drain region formed from the surface of the channel layer opposing at least part of the drain wiring finger to the interior of the channel layer, and a first conductivity type gate region formed from the surface of the channel layer opposing at least part of the gate wiring finger to the interior of the channel layer. The field effect transistor further includes a source electrode connecting the source wiring finger and the source region, a drain electrode connecting the drain wiring finger and the drain region, and a gate electrode connecting the gate wiring finger and the gate region.

Preferably, the active layer includes a first conductivity type buffer layer, a second conductivity type channel layer formed on the buffer layer, a first conductivity type RESURF layer formed on the channel layer and having a surface, a second conductivity type source region formed to extend from the surface of the RESURF layer opposing at least part of the source wiring finger to the channel layer, a second conductivity type drain region formed to extend from the surface of the RESURF layer opposing at least part of the drain wiring finger to the channel layer, and a first conductivity type gate region formed to extend from the surface of the RESURF layer opposing at least part of the gate wiring finger to the channel layer. The field effect transistor further includes a source electrode connecting the source wiring finger and the source region, a drain electrode connecting the drain wiring finger and the drain region, and a gate electrode connecting the gate wiring finger and the gate region.

Preferably, the active layer includes a first conductivity type buffer layer, a first conductivity type body layer formed on the buffer layer and having a surface, a second conductivity type source region formed from the surface of the body layer opposing at least part of the source wiring finger to an interior of the body layer, and a second conductivity type drain region formed from the surface of the body layer opposing at least part of the drain wiring finger to the interior of the body layer. The field effect transistor further includes a gate electrode formed below at least part of the gate wiring finger and formed on the body layer, with an insulating layer interposed therebetween, a source electrode connecting the source wiring finger and the source region, and a drain electrode connecting the drain wiring finger and the drain region.

Preferably, the active layer includes a first conductivity type buffer layer, a second conductivity type channel layer formed on the buffer layer and having a surface, a second conductivity type source region formed from the surface of the channel layer opposing at least part of the source wiring finger to an interior of the channel layer, and a second conductivity type drain region formed from the surface of the channel layer opposing at least part of the drain wiring finger to the interior of the channel layer. The field effect transistor further includes a gate electrode formed below at least part of the gate wiring finger, being in contact with the channel layer and exhibiting the Schottky characteristics, a source electrode connecting the source wiring finger and the source region, and a drain electrode connecting the drain wiring finger and the drain region.

Preferably, the field effect transistor further includes a first conductivity type base region formed below at least part of the source wiring finger and extending from the surface to the buffer layer and a base electrode connecting the source wiring finger and the base region.

Preferably, the base region is surrounded by the source region when the field effect transistor is seen in plan view.

Preferably, the base electrode is provided below the source electrode.

Advantageous Effects of Invention

According to a field-effect transistor of the present invention, improved switching speed and reduced operationally defective products can be achieved.

DESCRIPTION OF EMBODIMENTS

Figure 1:
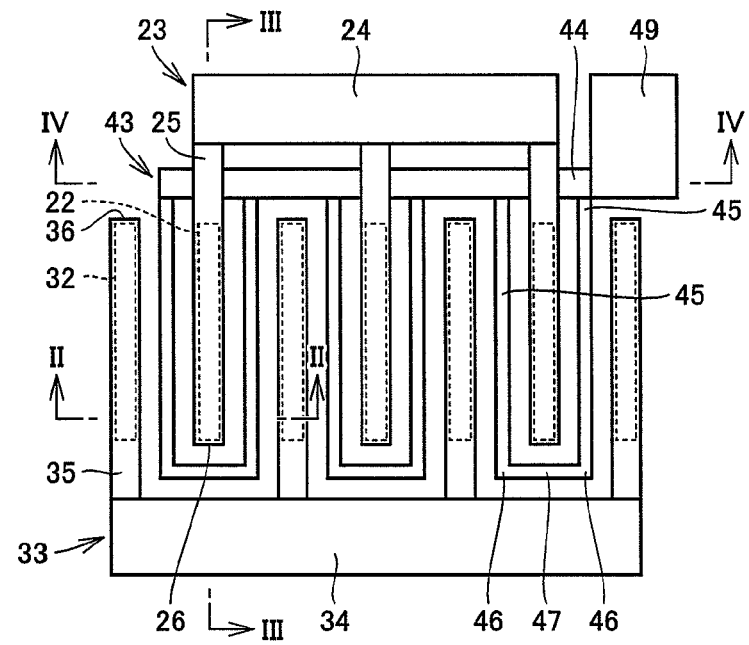
FIG. 1 is a schematic diagram showing a wiring shape of a lateral field-effect transistor of a first embodiment.

Embodiments of the present invention will be described hereinafter with reference to the drawings. In the drawings below, the same or corresponding elements have the same reference characters allotted, and description thereof will not be repeated.

First Embodiment

FIG. 1 is a schematic diagram showing a wiring shape of a lateral field-effect transistor of a first embodiment. FIG. 1 illustrates an arrangement of source wiring, drain wiring and gate wiring of the lateral field-effect transistor. As shown in FIG. 1, the lateral field-effect transistor of the present embodiment includes source wiring 23, drain wiring 33 and gate wiring 43. Source wiring 23 is formed in a comb shape having a base 24 and a plurality of fingers 25 protruding from base 24. A plurality of fingers 25 of source wiring 23 are each connected to base 24. Drain wiring 33 is formed in a comb shape having a base 34 and a plurality of fingers 35 protruding from base 34. A plurality of fingers 35 of drain wiring 33 are each connected to base 34.

Source wiring 23 and drain wiring 33 are arranged to oppose each other such that fingers 25 of comb-shaped source wiring 23 and fingers 35 of comb-shaped drain wiring 33 interdigitate. That is, source wiring 23 and drain wiring 33 are arranged such that fingers 25 of source wiring 23 and fingers 35 of drain wiring 33 are arranged alternately.

Source wiring 23 shown in FIG. 1 has three fingers 25. Fingers 25 protrude from one side of base 24 in a manner orthogonal to base 24. Drain wiring 33 shown in FIG. 1 has four fingers 35. Fingers 35 protrude from one side of base 34 in a manner orthogonal to base 24. Source wiring 23 and drain wiring 33 are arranged such that three fingers 25 of source wiring 23 are inserted between four fingers 35 of drain wiring 33.

Base 24 of source wiring 23 and base 34 of drain wiring 33 are arranged in parallel to each other. Fingers 25 of source wiring 23 extend from base 24 toward base 34 of drain wiring 33. Fingers 35 of drain wiring 33 extend from base 34 toward base 24 of source wiring 23. Fingers 25 of source wiring 23 and fingers 35 of drain wiring 33 are disposed in parallel to each other and arranged one by one alternately.

Below the portions of fingers 25 of source wiring 23 disposed being interdigitated with fingers 35 of drain wiring 33, source electrodes 22 shown in FIG. 1 in a dotted line are arranged. Below the portions of fingers 35 of drain wiring 33 disposed being interdigitated with fingers 25 of source wiring 23, drain electrodes 32 shown in FIG. 1 in a dotted line are arranged. "Above" herein indicates farther away from a substrate in a depositional direction of a semiconductor, while "below" indicates closer to the substrate in the depositional direction of the semiconductor.

Gate wiring 43 has a base 44 and a plurality of fingers 45 protruding from base 44. When the transistor is seen in plan view, on the side in the vicinity of base 24 of source wiring 23, base 44 of gate wiring 43 is arranged. Base 44 of gate wiring 43 is arranged between base 24 of source wiring 23 and fingers 35 of drain wiring 33. Base 44 of gate wiring 43 is arranged below fingers 25 of source wiring 23 and intersects with fingers 25 of source wiring 23, with an insulating film interposed therebetween. Base 44 of gate wiring 43 has one end connected to a gate pad 49 formed of a conductive material such as metal.

Fingers 45 of gate wiring 43 protrude from one side of base 44 in a manner orthogonal to base 44. The plurality of fingers 45 of gate wiring 43 are arranged in parallel to each other. Finger 45 of gate wiring 43 is arranged between finger 25 of source wiring 23 and finger 35 of drain wiring 33. Fingers 45 of gate wiring 43 extend from base 44 toward base 34 of drain wiring 33. Fingers 45 of gate wiring 43, fingers 25 of source wiring 23 and fingers 35 of drain wiring 33 are disposed in parallel to each other.

Gate wiring 43 further has a connection 47 connecting tips 46 of adjacent fingers 45. Tips 46 of a pair of adjacent fingers 45 on the side along base 34 of drain wiring 33 are connected to each other by connection 47. As to fingers 45 of gate wiring 43, adjacent ones are connected on their distal ends to each other by connection 47, with finger 25 of source wiring 23 sandwiched therebetween. Fingers 45 and connection 47 of gate wiring 43 are formed in a U-shape surrounding finger 25 of source wiring 23.

Figure 2:
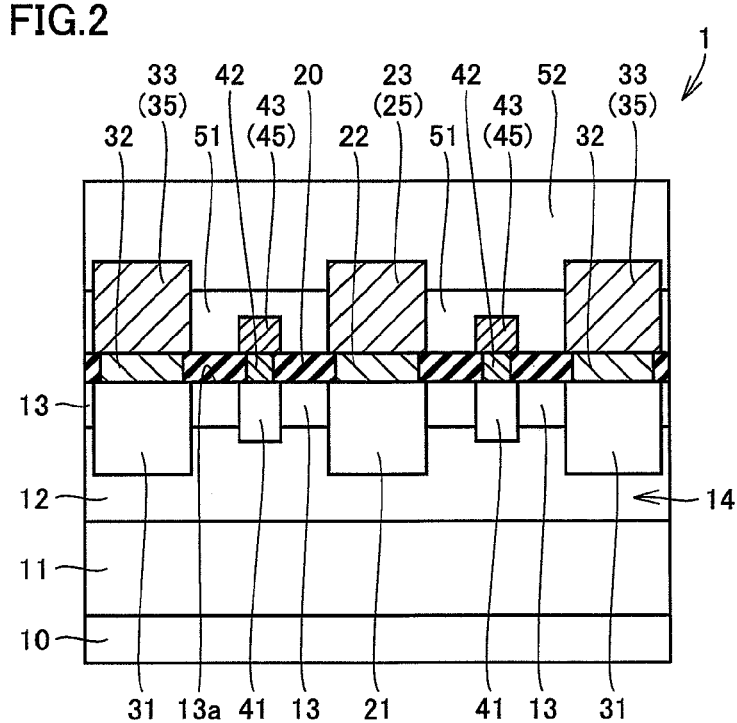
FIG. 2 is a cross-sectional view of the lateral field-effect transistor of the first embodiment.

FIG. 2 is a cross-sectional view of the lateral field-effect transistor of the first embodiment. FIG. 2 illustrates a cross section along a line II-II in FIG. 1 of a lateral RESURF-JFET (REduced SURface Field Junction Field Effect Transistor) 1 to serve as an example of the lateral field-effect transistor.

In RESURF-JFET 1 shown in FIG. 2, an active layer 14 made of a semiconductor is formed on a substrate 10 formed of a semiconductor such as SiC. RESURF-JFET 1 has substrate 10 and active layer 14 formed on substrate 10. Source wiring 23, drain wiring 33 and gate wiring 43 are formed above active layer 14.

Active layer 14 includes a p− type buffer layer 11 formed on substrate 10, an n type channel layer 12 formed on buffer layer 11 and a p type RESURF layer 13 formed on channel layer 12. RESURF layer 13 has a surface 13a. An n+ type source region 21, an n+ type drain region 31 and a p+ type gate region 41 are formed at a distance from each other and in a manner extending from surface 13a of RESURF layer 13 to channel layer 12.

Buffer layer 11, RESURF layer 13 and gate region 41 have p type conductivity as a first conductivity type. Gate region 41 has a higher p type impurity concentration than the p type impurity concentration in RESURF layer 13. Buffer layer 11 has a lower p type impurity concentration than the p type impurity concentration in RESURF layer 13. Channel layer 12, source region 21 and drain region 31 have n type conductivity as a second conductivity type. Source region 21 and drain region 31 have a higher n type impurity concentration than the n type impurity concentration in channel layer 12.

On surface 13a to serve as an upper surface of RESURF layer 13, a field oxide film 20 made of an insulating material is formed. In field oxide film 20, a plurality of openings are formed. In the opening located on source region 21, source electrode 22 is formed. In the opening located on drain region 31, drain electrode 32 is formed. In the opening located on gate region 41, gate electrode 42 is formed.

Field oxide film 20 is formed to cover the entire region on surface 13a of RESURF layer 13 except the region where source electrode 22, drain electrode 32 and gate electrode 42 are formed. This results in that field oxide film 20 electrically isolates each of source electrode 22, drain electrode 32 and gate electrode 42.

Source region 21 to which electrons are supplied is formed to oppose finger 25 of source wiring 23. On source electrode 22 above source region 21, source wiring 23 made of a conductive material such as metal is formed. Source electrode 22 electrically connects finger 25 of source wiring 23 and source region 21.

Drain region 31 from which electrons are drawn is formed to oppose finger 35 of drain wiring 33. On drain electrode 32 above drain region 31, drain wiring 33 made of a conductive material is formed. Drain electrode 32 electrically connects finger 35 of drain wiring 33 and drain region 31.

Gate region 41 which is arranged between source region 21 and drain region 31 and establishes and interrupts an electrical connection between source region 21 and drain region 31 is formed to oppose finger 45 of gate wiring 43. On gate electrode 42 above gate region 41, gate wiring 43 made of a conductive material is formed. Gate electrode 42 electrically connects finger 45 of gate wiring 43 and gate region 41.

On field oxide film 20, an interlayer insulating film 51 is formed. Interlayer insulating film 51 is formed to cover gate wiring 43 and to fill between source wiring 23 and drain wiring 33. Interlayer insulating film 51 electrically insulates between source wiring 23 and gate wiring 43 and electrically insulates between drain wiring 33 and gate wiring 43.

On interlayer insulating film 51, a passivation film 52 is formed. Passivation film 52 is formed to cover entire RESURF-JFET 1, including entire source wiring 23 and drain wiring 33. Passivation film 52 operates as a surface protective film which externally protects RESURF-JFET 1.

Figure 3:
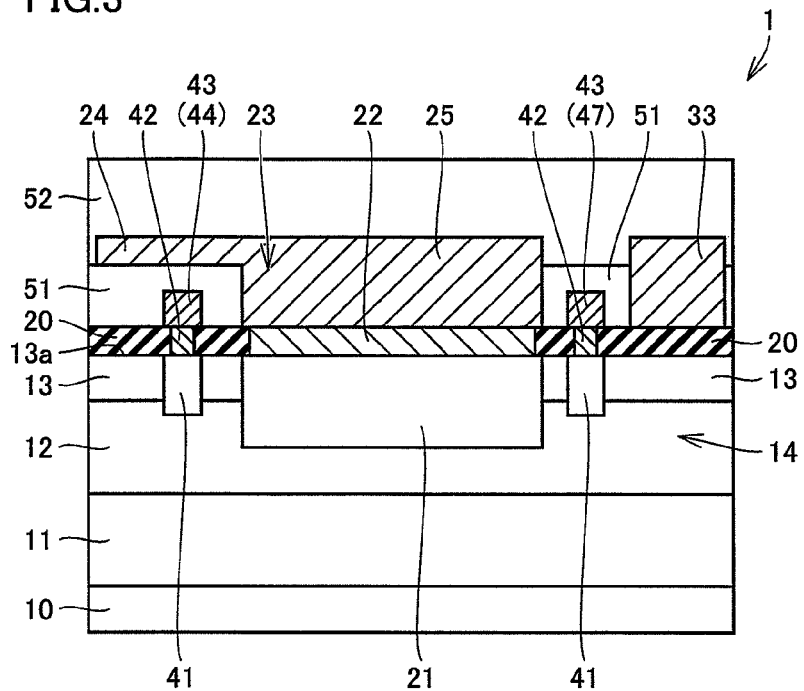
FIG. 3 is another cross-sectional view of the lateral field-effect transistor of the first embodiment.

FIG. 3 is another cross-sectional view of the lateral field-effect transistor of the first embodiment. FIG. 3 illustrates a cross section along a line III-III in FIG. 1 of RESURF-JFET 1. FIG. 3 illustrates base 44 and connection 47 of gate wiring 43. Below base 44 and connection 47, gate region 41 is formed. Base 44 and connection 47 of gate wiring 43 are each connected to gate region 41 via gate electrode 42.

Between base 44 and connection 47 of gate wiring 43, finger 25 of source wiring 23 is provided. Below finger 25 of source wiring 23, source region 21 is formed. On a left end of source wiring 23 shown in FIG. 3, base 24 of source wiring 23 is arranged. In FIG. 3, finger 25 of source wiring 23 extends from above gate region 41 to a position to cover base 44 of gate wiring 43, in the lateral direction in the drawing. Base 44 of gate wiring 43 intersects with a portion of finger 25 of source wiring 23 closest to base 24, with interlayer insulating film 51 interposed between base 44 of gate wiring 43 and finger 25 of source wiring 23.

FIG. 3 illustrates base 34 of drain wiring 33. Drain electrode 32 is arranged below finger 35 of drain wiring 33 as described with reference to FIG. 1, however, not arranged below base 34 of drain wiring 33. Thus, in FIG. 3, drain electrode 32 and drain region 31 are not arranged below drain wiring 33.

Figure 4:
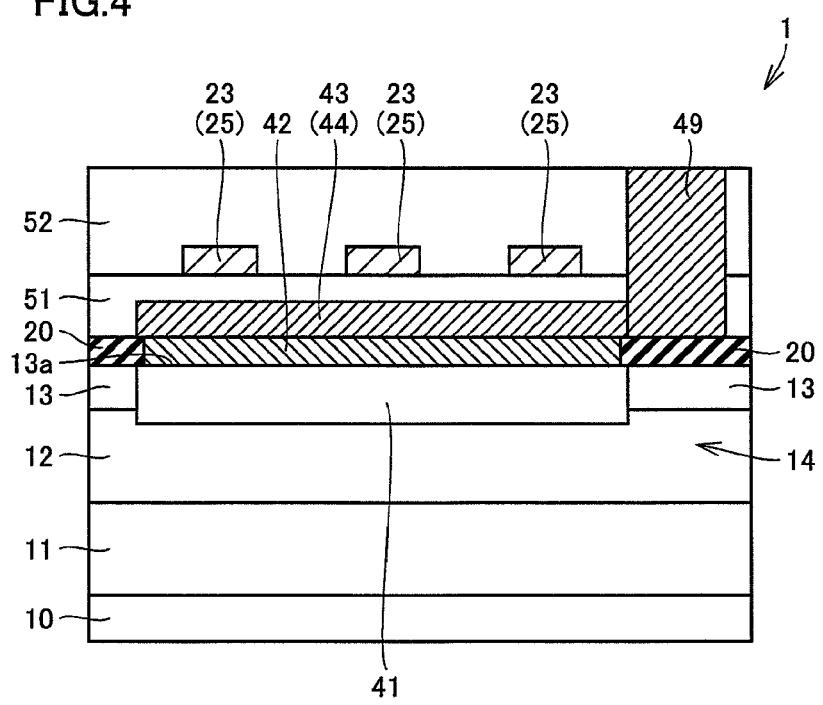
FIG. 4 is still another cross-sectional view of the lateral field-effect transistor of the first embodiment.

FIG. 4 is still another cross-sectional view of the lateral field-effect transistor of the first embodiment. FIG. 4 illustrates a cross section along a line IV-IV in FIG. 1 of RESURF-JFET 1. FIG. 4 illustrates base 44 of gate wiring 43 extending in the lateral direction in the drawing. Below base 44, gate region 41 is formed. Base 44 of gate wiring 43 is connected to gate region 41 via gate electrode 42.

Base 44 of gate wiring 43 is covered with interlayer insulating film 51. On interlayer insulating film 51, fingers 25 of source wiring 23 are arranged to be covered with passivation film 52. That is, as is clear from FIGS. 3 and 4, interlayer insulating film 51 is interposed between fingers 25 of source wiring 23 and base 44 of gate wiring 43. This electrically isolates between fingers 25 of source wiring 23 and base 44 of gate wiring 43.

One end of base 44 of gate wiring 43 is connected to gate pad 49. Gate pad 49 extends from the top of field oxide film 20 through interlayer insulating film 51 and passivation film 52 in the thickness direction to be exposed on an outer surface of RESURF-JFET 1. Electrical connection between an external electrical circuit and gate wiring 43 is made possible via gate pad 49 arranged in this way.

Figure 5:
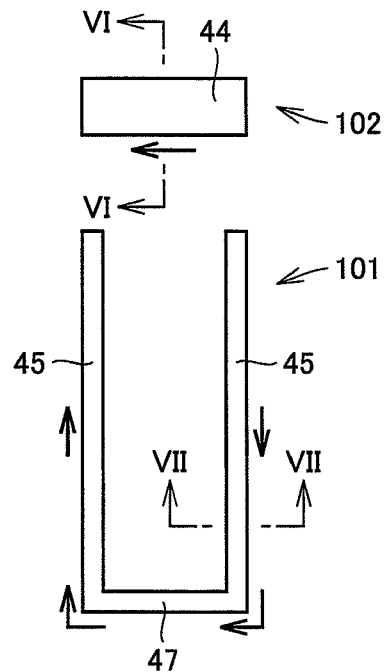
FIG. 5 is an exploded view of part of a gate wiring.

FIG. 5 is an exploded view of part of gate wiring 43. FIG. 5 shows a pair of adjacent fingers of gate wiring 43 and connection 47 connecting fingers 45, which make up first wiring 101. First wiring 101 has a U-shaped structure formed by fingers 45 and connection 47 of gate wiring 43. The section of base 44 of gate wiring 43 between two points where adjacent fingers 45 connected by connection 47 are connected to base 44 makes up second wiring 102 which is electrically parallel with first wiring 101. Second wiring 102 is a portion of base 44 which connects two points of base 44 corresponding to positions to which two points on the tip ends of the U-shaped structure of first wiring 101 are connected. U-shaped first wiring 101 and linear second wiring 102 are electrically parallel to each other.

Gate wiring 43 is formed such that first wiring 101 has an electrical resistance not less than the electrical resistance of second wiring 102. Relative to the electrical resistance of a conductive path formed by fingers 45 and connection 47 of gate wiring 43 arranged in a U-shape, a portion of base 44 of gate wiring 43 in parallel with the conductive path has an equal or less electrical resistance. For this reason, current flows more easily through second wiring 102 than through first wiring 101. That is, when a voltage is applied to base 44 forming second wiring 102, current flowing through an interior of base 44 is larger than current which is indicated by an arrow in FIG. 5 and flows from finger 45 on the right in the drawing by way of connection 47 to finger 45 on the left.

Figure 6:
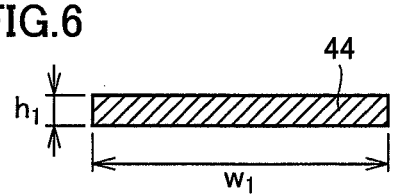
FIG. 6 is a cross-sectional view along a line VI-VI in FIG. 5 of a base of the gate wiring.
Figure 7:
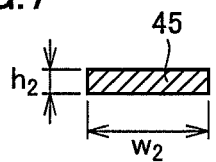
FIG. 7 is a cross-sectional view along a line VII-VII in FIG. 5 of a finger of the gate wiring.

FIG. 6 is a cross-sectional view along a line VI-VI in FIG. 5 of base 44 of gate wiring 43. FIG. 7 is a cross-sectional view along a line VII-VII in FIG. 5 of finger 45 of gate wiring 43. Comparing FIG. 6 and FIG. 7, finger 45 of gate wiring 43 has a vertical cross-sectional area not more than the vertical cross-sectional area of base 44 of gate wiring 43. Here, "vertical cross-sectional area" refers to the cross-sectional area of wiring when cut at right angle to a direction in which the wiring extends.

For example, base 44 of gate wiring 43 may have a width w1 of 5 µm and a thickness h1 of 0.1 µm. The length of base 44 forming second wiring 102 to be in parallel with U-shaped first wiring 101 may be 10 µm. Further, finger 45 of gate wiring 43 may have a width w2 of 2 µm and a thickness h2 of 0.1 µm, and finger 45 may have a length of 150 µm.

In RESURF-JFET 1 having the configuration above, a plurality of fingers 45 are formed in a manner protruding from base 44 of gate wiring 43, and a plurality of fingers 45 are connected to base 44 in parallel. For this reason, as compared with conventional meander-shaped gate wiring, a difference between electrical resistances of a path from gate pad 49 to finger 45 close to gate pad 49 and a path to finger 45 distant from gate pad 49 can be made smaller. Therefore, a time lag in gate voltage change between finger 45 close to gate pad 49 and finger 45 away from gate pad 49 can be made small.

Gate wiring 43 is formed such that the electrical resistance of first wiring 101 formed by fingers 45 and connection 47 of gate wiring 43 is not less than the electrical resistance of second wiring 102 formed by base 44 and in parallel with first wiring 101. Since the electrical resistance in base 44 of gate wiring 43 is small, the resistance to current flowing through base 44 can be made small. At the same time, since current flows through base 44 more easily as compared with finger 45, a time lag in gate voltage change between finger 45 close to gate pad 49 and finger 45 distant from gate pad 49 can be made smaller. By making the vertical cross-sectional area of finger 45 of gate wiring 43 not more than the vertical cross-sectional area of base 44, a more remarkable effect of achieving a smaller resistance of base 44 as compared with finger 45 can be obtained.

Further, since base 44 of gate wiring 43 is arranged between base 24 of source wiring 23 and drain wiring 33, source wiring 23 and gate wiring 43 have smaller intersecting area therebetween. Generally, base 24 of source wiring 23 has a larger width (the size in a direction orthogonal to a direction in which base 24 extends (the vertical direction in FIG. 1) than the width of base 44 of gate wiring 43. For this reason, as compared with the intersecting area between a base of source wiring and fingers of gate wiring in the conventional art where fingers of the comb-shaped gate wiring run below the base of the source wiring, the intersecting area between fingers 25 of source wiring 23 and base 44 of gate wiring 43 in the configuration of the present embodiment can be made smaller. Accordingly, a smaller gate-to-source capacity can be achieved, and therefore, time required for charging/discharging a gate circuit can be shortened.

As such, RESURF-JFET 1 of the present embodiment has a smaller time lag in a gate voltage change and a shorter time required for charging/discharging a gate circuit, and therefore, an improved switching speed of RESURF-JFET 1 can be achieved.

At the same time, in RESURF-JFET 1 of the present embodiment, since a plurality of fingers 45 are connected in parallel to base 44 of gate wiring 43, a missing pattern occurred in one finger 45 does not affect transmission of a gate voltage change to other fingers 45. Further, since two adjacent fingers 45 and connection 47 form U-shaped wiring which has two connection points to base 44, even if a missing pattern occurs at one point on finger 45 and the wiring breaks, it is possible to transmit a gate voltage change to a portion of wiring ahead thereof, from the other connection with base 44, thereby to operate the transistor. In a case where two or more points within one U-shaped wiring break, although a portion where transistor does not operate is created, there is no effect on transmission of a gate voltage change to other fingers 45 in this case as well. Occurrence of an operationally defective transistor product can therefore be suppressed.

A missing pattern could also occur in base 44 of gate wiring 43. However, by making the vertical cross-sectional area of finger 45 of gate wiring 43 not more than the vertical cross-sectional area of base 44, it is possible to reduce the possibility that the missing pattern causes gate wiring 43 to break in base 44, as compared with finger 45. Occurrence of an operationally defective transistor product can therefore be further suppressed.

Figure 8:
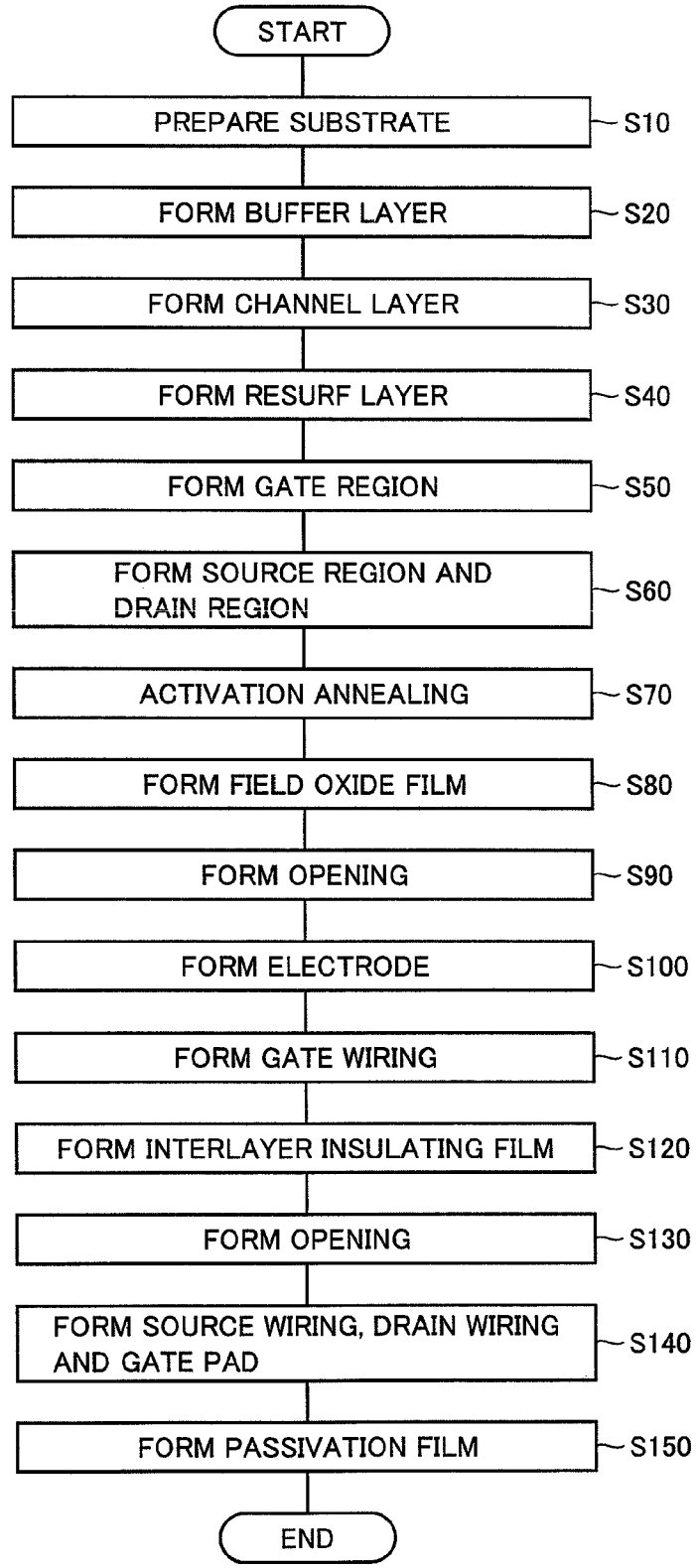
FIG. 8 is a flowchart showing a method for manufacturing the lateral field-effect transistor of the first embodiment.

Next, a method for manufacturing RESURF-JFET 1 shown in FIGS. 2 to 4 will be described. FIG. 8 is a flow chart showing a method for manufacturing the lateral field-effect transistor of the first embodiment. In a method for manufacturing RESURF-JFET 1 implementing the lateral field-effect transistor according to the present embodiment, the following steps are performed.

First, substrate 10 to serve as a semiconductor substrate is prepared (S10). For example, an n type substrate of such as single crystal type SiC called 4H-SiC is prepared. Buffer layer 11 which is located on a main surface of substrate 10 and made of an SiC layer including a p type impurity as a first conductivity type impurity is then formed (S20). Buffer layer 11 can have a thickness of 10 μm, for example, and an epitaxial growth method can be used as a film forming method. Aluminum (Al) may be used as a p type impurity. Buffer layer 11 has a p type impurity concentration of, for example, $1.0 \times 10^{16}$ cm$^{-3}$.

Channel layer 12 located on buffer layer 11 and including a second conductivity type (n type) impurity having a higher concentration than the concentration of the p type impurity in buffer layer 11 is then formed (S30). Nitrogen (N) may be used as an n type impurity. Channel layer 12 may have a thickness of 0.4 μm, for example. Channel layer 12 may have a concentration of the n type conductive impurity of $2.0 \times 10^{17}$ cm$^{-3}$. Subsequently, RESURF layer 13 is formed on channel layer 12 (S40). RESURF layer 13 includes a first conductivity type (p type) impurity having a higher concentration than the concentration of the p type impurity in buffer layer 11. RESURF layer 13 may have a thickness of, for example, 0.25 μm and RESURF layer 13 may have a p type conductive-impurity concentration of $2.0 \times 10^{17}$ cm$^{-3}$.

Gate region 41 including a first conductivity type (p type) impurity is then formed to extend from surface 13*a* of RESURF layer 13 through RESURF layer 13 to channel layer 12 (S50). Specifically, a patterned resist film is formed using a photolithography method. By means of the resist film as a mask, aluminum (Al) is implanted into RESURF layer 13 and channel layer 12 using an ion implantation method. In this way, gate region 41 of p type conductivity is formed. Gate region 41 may have a depth of, for example, 0.4 μm. Further, gate region 41 may have a p type impurity concentration of, for example, $1.0 \times 10^{19}$ cm$^{-3}$.

Source region 21 and drain region 31 opposing each other with gate region 41 sandwiched therebetween and including a second conductivity type (n type) impurity are then formed to extend from surface 13*a* of RESURF layer 13 through RESURF layer 13 to channel layer 12 (S60). Specifically, as in the above-described step for forming gate region 41, source region 21 and drain region 31 of n type conductivity are formed by implanting phosphorus (P) into RESURF layer 13 and channel layer 12 using an ion implantation method. Source region 21 and drain region 31 may have a depth of 0.4 μm, for example. Source region 21 and drain region 31 may have an n type impurity concentration of, for example, $5.0 \times 10^{19}$ cm$^{-3}$.

Activation annealing for activating ions implanted into the above-described gate region 41, source region 21, and drain region 31 is then performed (S70). As to conditions for the activation-annealing step, for example, argon gas may be used as an ambient, and a heating temperature of 1700° C. and a heating time of 30 minutes may be employed. It is noted that the ambient pressure in annealing may be 100 kPa, for example. Field oxide film 20 is then formed (S80). Specifically, surface 13*a* of RESURF layer 13 is thermally oxidized to form field oxide film 20 by heating, in an oxygen atmosphere, substrate 10 which has been subjected to the above-described processes. As to heating conditions, for example, a heating temperature of 1300° C. and a heating time of 60 minutes may be employed. It is noted that the ambient pressure in heating may be at the atmospheric pressure. As a result, field oxide film 20 having a thickness of 0.1 μm is formed.

An opening is then formed in a predetermined region of field oxide film 20 (S90). The opening is formed at a position where an electrode is formed in a subsequent step. Specifically, a resist film having a predetermined pattern is formed on field oxide film 20 using a photolithography method. This resist film has an opening pattern formed in a region in which opening is to be formed. Using this resist film as a mask, field oxide film 20 is partially removed by etching. In this way, the opening is formed.

An ohmic electrode is then formed within the opening (S100). Specifically, a conductive material film (for example, a nickel (Ni) film) constituting the ohmic electrode is formed within the opening and on the upper surface of the resist film using a vapor deposition method. Subsequently, by removing the resist film, a portion of the Ni film formed on the resist film is also removed (lift-off procedure). Then, in an argon atmosphere, the SiC substrate on which the Ni film has been formed is heat-treated and the Ni film is turned into the ohmic electrode. As to the conditions for this heat treatment, for example, a heating temperature of 950° C. and a heating time of 2 minutes may be employed. Further, the pressure of the argon atmosphere may be at the atmospheric pressure. In this way, source electrode 22 in contact with source region 21, drain electrode 32 in contact with drain region 31, and gate electrode 42 in contact with gate region 41 are formed.

Gate wiring 43 is then formed on gate electrode 42 (S110). Specifically, a patterned resist film is formed on gate electrode 42 using a photolithography method. The resist film has an opening pattern formed to expose gate electrode 42. A conductive material film (for example, an aluminum film) to turn into gate wiring 43 is formed by vapor deposition onto the interior of the opening pattern of the resist film. The aluminum film may have a thickness of 0.1 μm, for example. Subsequently, part of the conductive material film located on the resist film is removed by removing the resist film (lift-off procedure). As a result, gate wiring 43 located on gate electrode 42 is obtained.

Interlayer insulating film 51 covering gate wiring 43 is then formed (S120). Specifically, a plasma CVD (Chemical Vapor Deposition) method is used to form interlayer insulating film 51 made of an SiO$_2$ film having a thickness of 0.2 μm. In this way, interlayer insulating film 51 is formed to be in contact with the surfaces of gate wiring 43, source electrode 22, drain electrode 32, and field oxide film 20.

Part of interlayer insulating film 51 is then removed to form openings in predetermined regions of interlayer insulating film 51 (S130). The openings are formed at positions where gate pad 49, source wiring 23 and drain wiring 33 are to be formed in a subsequent step. Specifically, after a resist is applied onto interlayer insulating film 51, exposure and development are performed, and a resist film having an opening in a desired region of interlayer insulating film 51 is formed. The resist film is used as a mask to partially remove interlayer insulating film 51, for example, by RIE (Reactive Ion Etching). In this way, interlayer insulating film 51 in contact with source electrode 22 and drain electrode 32 is removed, and interlayer insulating film 51 in a region corresponding to the arrangement of gate pad 49 is removed as well.

Source wiring 23 including a pad, drain wiring 33 including a pad and gate pad 49 are then formed (S140). Specifically, on interlayer insulating film 51 partially removed by RIE, an aluminum film made of aluminum and having a thickness of 3 µm is formed by, for example, spattering and etched into a desired shape, so that source wiring 23, drain wiring 33 and gate pad 49 are formed.

Passivation film 52 is then formed (S150). Specifically, on the entire top surface of RESURF-JFET 1 except a pad portion such as gate pad 49 to be externally connected, for example, on the surface of interlayer insulating film 51 and above source wiring 23 and drain wiring 33 formed in step (S140), passivation film 52 made of an $SiO_2$ film having a thickness of 5 µm is formed by, for example, plasma CVD. By forming passivation film 52 to serve as a protection film, RESURF-JFET 1 is externally protected.

Such a manufacturing method can readily provide RESURF-JFET 1 capable of improving the switching speed and reducing operationally defective products, as shown in FIGS. 2 to 4.

Second Embodiment

Figure 9:
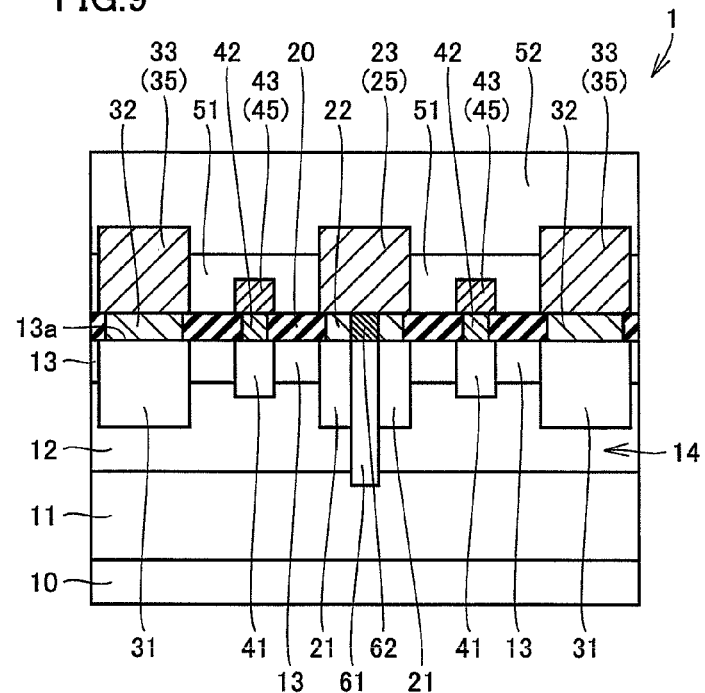
FIG. 9 is a cross-sectional view of a lateral field-effect transistor of a second embodiment.

FIG. 9 is a cross-sectional view of a lateral field-effect transistor of a second embodiment. The lateral RESURF-JFET 1 shown in FIG. 9 to serve as an example of the lateral field-effect transistor has the same basic configuration as that of RESURF-JFET 1 of the first embodiment. RESURF-JFET 1 of the second embodiment is, however, different from RESURF-JFET 1 of the first embodiment in that a base region 61 electrically in contact with buffer layer 11 is formed.

Specifically, RESURF-JFET 1 of the second embodiment includes p+ type base region 61 which is formed below part of finger 25 of source wiring 23. Base region 61 is formed to extend from surface 13a of RESURF layer 13 to buffer layer 11. On base region 61, a base electrode 62 which is in contact with base region 61 is formed. Base electrode 62 connects finger 25 of source wiring 23 and base region 61. Base electrode 62 is electrically in contact with buffer layer 11. Base electrode 62 is arranged to be in contact with source electrode 22 and has the same electric potential as that of source electrode 22.

Although base electrode 62 can be placed at any place as long as a connection with source wiring 23 can be made, it is desirable that the electrode be provided under finger 25 of source wiring 23 together with source electrode 22. FIG. 9 illustrates a cross section of RESURF-JFET 1, however, it is more preferable that base electrode 62 be surrounded by source electrode 22 in plan view. That is, it is more preferable that base region 61 be surrounded by source region 21 when RESURF-JFET 1 is seen in plan view.

In RESURF-JFET 1 of the second embodiment having such a configuration, since base electrode 62 is provided below finger 25 of source wiring 23 together with source electrode 22, stabilization of operation of a transistor cell is promoted. Further, extension of a depletion layer in an OFF operation of the transistor and contraction of the depletion layer in an ON operation within buffer layer 11 are promoted. Therefore, an improved switching speed of RESURF-JFET 1 can be achieved. Base region 61 surrounded by source region 21 in plan view can provide a more stable operation of the transistor.

A method for manufacturing RESURF-JFET 1 shown in FIG. 9 is basically the same as the method for manufacturing RESURF-JFET 1 of the first embodiment basically shown in FIG. 8, however, different in that the step of forming base region 61 is added. Specifically, steps (S10) to (S60) shown in FIG. 8 are performed. Subsequently, aluminum ion implantation is performed with a depth reaching buffer layer 11 to form p+ type base region 61. Base region 61 may have a depth of 0.9 µm, for example. Base region 61 may have a p type impurity concentration of, for example, $1.0 \times 10^{19}$ cm$^{-3}$.

Activation annealing for activating ions implanted into base region 61 simultaneously with gate region 41, source region 21 and drain region 31 is then performed in step (S70). Subsequently, steps (S80) to (S90) are performed, and in step (S100), an ohmic electrode is formed integrated with source electrode 22 and on base region 61 so as to form base electrode 62. Subsequently, steps (S110) to (S150) are performed. In this way, RESURF-JFET 1 including base region 61 shown in FIG. 9 can be obtained.

Third Embodiment

Figure 10:
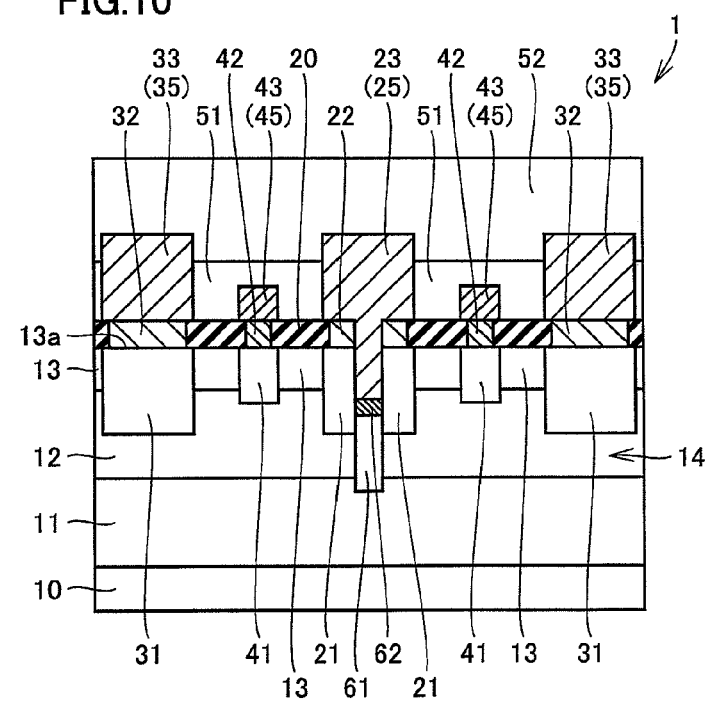
FIG. 10 is a cross-sectional view of a lateral field-effect transistor of a third embodiment.

FIG. 10 is a cross-sectional view of a lateral field-effect transistor of a third embodiment. The lateral RESURF-JFET 1 shown in FIG. 10 to serve as an example of the lateral field-effect transistor has the same basic configuration as that of RESURF-JFET 1 of the second embodiment shown in FIG. 9. RESURF-JFET 1 of the third embodiment is, however, different from RESURF-JFET 1 of the first embodiment in that base electrode 62 is provided below source electrode 22.

In RESURF-JFET 1 of the third embodiment, a trench engraved from surface 13a of RESURF layer 13 toward buffer layer 11 is formed. Base region 61 is formed below the trench. Base electrode 62 is provided at the bottom of the trench so as to be in contact with base region 61. As a result, base electrode 62 is formed below source electrode 22 surrounding base electrode 62 in plan view, namely, formed in more proximity to buffer layer 11 than the source electrode.

In RESURF-JFET 1 of the third embodiment having such a configuration, base region 61 including a p type impurity can be formed by forming a trench engraved from surface 13a of RESURF layer 13 and performing ion implantation into the bottom of the trench. That is, there is no need to perform deep ion implantation from surface 13a of RESURF layer 13 toward buffer layer 11 in order to form base region 61. Therefore, a simpler and easier process of manufacturing RESURF-JFET 1 can be achieved.

A method for manufacturing RESURF-JFET 1 shown in FIG. 10 is basically the same as the method for manufacturing RESURF-JFET 1 of the first embodiment basically shown in FIG. 8, however, different in that the step of forming a trench in RESURF layer 13 and forming base region 61 thereafter is added. Specifically, steps (S10) to (S40) shown in FIG. 8 are performed. Subsequently, a trench is formed by RIE in a region corresponding to a place where base region 61 is to be formed. The depth of the trench is determined to be to such an extent that when ion implantation of a p type impurity into the bottom of the trench is performed with the same implantation depth as that of gate region 41, the region subjected to the ion implantation reaches buffer layer 11. For example, the trench may have a depth of 0.5 μm.

Next, in step (S50), simultaneously with ion implantation for forming gate region 41, aluminum ion implantation is performed from the bottom of the trench formed in the previous step. This forms, below the trench, base region 61 including the p type impurity. Base region 61 may have a depth of 0.4 μm, for example. Further, base region 61 may have a p type impurity concentration of, for example, $1.0 \times 10^{19}$ cm$^{-3}$.

Then, step (S60) is performed, followed by step (S70) in which activation annealing for activating ions implanted into base region 61 simultaneously with gate region 41, source region 21 and drain region 31 is performed. Subsequently, steps (S80) to (S90) are performed, and in step (S100), simultaneously with the formation of source electrode 22, drain electrode 32 and gate electrode 42, an ohmic electrode is formed on base region 61 to form base electrode 62. Subsequently, steps (S110) to (S150) are performed. In this way, RESURF-JFET 1 shown in FIG. 10 and having base electrode 62 provided below source electrode 22 can be obtained.

Fourth Embodiment

Figure 11:
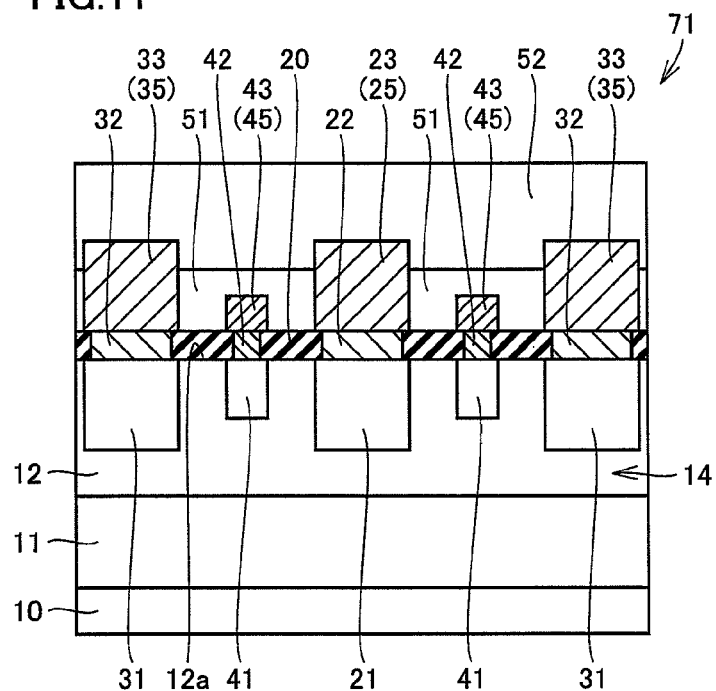
FIG. 11 is a cross-sectional view of a lateral field-effect transistor of a fourth embodiment.

FIG. 11 is a cross-sectional view of a lateral field-effect transistor of a fourth embodiment. The lateral JFET 71 shown in FIG. 11 to serve as an example of the lateral field-effect transistor has the same basic configuration as that of RESURF-JFET 1 of the first embodiment. JFET 71 is, however, different from RESURF-JFET 1 of the first embodiment in that no RESURF layer is formed on channel layer 12 and in that channel layer 12 is formed also in a region where RESURF layer 13 is formed in RESURF-JFET 1 shown in FIG. 2.

Specifically, in JFET 71 shown in FIG. 11, active layer 14 includes p− type buffer layer 11 formed on substrate 10 and n type channel layer 12 formed on buffer layer 11. Channel layer 12 has a surface 12a. From surface 12a of channel layer 12 to the interior of channel layer 12, n+ type source region 21, n+ type drain region 31 and p+ type gate region 41 are formed. In field oxide film 20 formed on surface 12a to serve as an upper surface of channel layer 12, a plurality of openings are formed.

Within the opening located on source region 21, source electrode 22 is formed. Source region 21 is formed to oppose finger 25 of source wiring 23. Source electrode 22 electrically connects finger 25 of source wiring 23 and source region 21.

Within the opening located on drain region 31, drain electrode 32 is formed. Drain region 31 is formed to oppose finger 35 of drain wiring 33. Drain electrode 32 electrically connects finger 35 of drain wiring 33 and drain region 31.

Within the opening located on gate region 41, gate electrode 42 is formed. Gate region 41 is formed to oppose finger 45 of gate wiring 43. Gate electrode 42 electrically connects finger 45 of gate wiring 43 and gate region 41.

Also in JFET 71 having the configuration above, base 44 of gate wiring 43 is arranged between base 24 of source wiring 23 and drain wiring 33, and base 44 of gate wiring 43 and fingers 25 of source wiring 23 intersect with each other. For this reason, as in RESURF-JFET 1 of the first embodiment, a time lag in gate voltage change is smaller, and time required for charging/discharging a gate circuit is shortened, and therefore, an improved switching speed of JFET 71 can be achieved. Furthermore, occurrence of an operationally defective transistor product can be suppressed.

A method for manufacturing JFET 1 shown in FIG. 11 is basically the same as the method for manufacturing RESURF-JFET 1 of the first embodiment basically shown in FIG. 8, however, different in that step (S40) of forming RESURF layer 13 is not performed. Specifically, steps (S10) to (S20) shown in FIG. 8 are performed. Subsequently, on buffer layer 11, channel layer 12 is formed (S30). Channel layer 12 may have a thickness of 0.65 μm, for example. At surface 12a of channel layer 12, gate region 41 including a first conductivity type (p type) impurity is formed (S50).

At surface 12a of channel layer 12, source region 21 and drain region 31 which include a second conductivity type (n type) impurity are then formed to oppose each other, with gate region 41 sandwiched therebetween (S60). This is followed by activation annealing for activating ions implanted into gate region 41, source region 21 and drain region 31 (S70). Surface 12a of channel layer 12 is then thermally oxidized to form field oxide film 20 (S80). Subsequently, steps (S90) to (S150) are performed. In this way, JFET 71 shown in FIG. 11 can be obtained.

Fifth Embodiment

Figure 12:
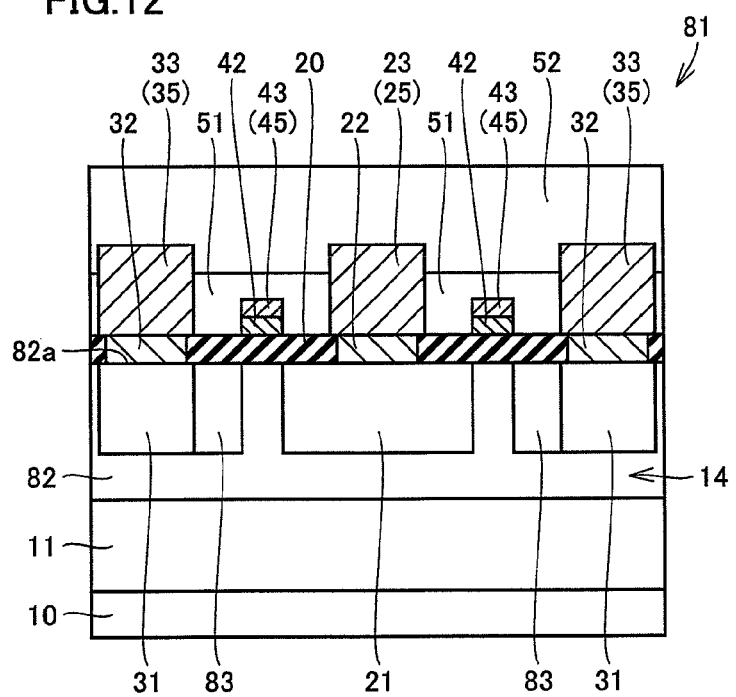
FIG. 12 is a cross-sectional view of a lateral field-effect transistor of a fifth embodiment.

FIG. 12 is a cross-sectional view of a lateral field-effect transistor of a fifth embodiment. The lateral MOSFET (Metal-Oxide-Semiconductor Field-Effect Transistor) 81 shown in FIG. 12 to serve as an example of lateral field-effect transistor has the same basic configuration as that of RESURF-JFET 1 of the first embodiment. In MOSFET 81, however, a p type body layer 82 is formed on buffer layer 11, and source region 21, drain region 31 and an n type drift layer 83 are formed within body layer 82, whereas gate region 41 shown in FIG. 2 is not formed. Gate electrode 42 is formed on field oxide film 20.

More specifically, in MOSFET 81 shown in FIG. 12, active layer 14 includes p− type buffer layer 11 formed on substrate 10 and p type body layer 82 formed on buffer layer 11. Body layer 82 has a surface 82a. From surface 82a of body layer 82 to the interior of body layer 82, n+ type source region 21 and n+ type drain region 31 are formed. In field oxide film 20 formed on surface 82a to serve as an upper surface of body layer 82, a plurality of openings are formed.

Within the opening located on source region 21, source electrode 22 is formed. Source region 21 is formed to oppose finger 25 of source wiring 23. Source electrode 22 is in contact with source region 21 and electrically connects finger 25 of source wiring 23 and source region 21.

Within the opening located on drain region 31, drain electrode 32 is formed. Drain region 31 is formed to oppose finger 35 of drain wiring 33. Drain electrode 32 is in contact with drain region 31 and electrically connects finger 35 of drain wiring 33 and drain region 31.

N type drift layer 83 is formed from surface 82a of body layer 82 to the interior of body layer 82. Drift layer 83 is arranged to be in contact with drain region 31 on a side of drain region 31 facing source region 21 and to be spaced from source region 21.

Gate electrode 42 is formed on insulating field oxide film 20 formed on body layer 82. Gate electrode 42 is formed on body layer 82, with field oxide film 20 to serve as an insulating layer interposed therebetween. Gate electrode 42 is in contact with field oxide film 20. Field oxide film 20, with which gate electrode 42 is in contact, is in contact with body layer 82 and also in contact with source region 21 and drift layer 83 which are formed within body layer 82. Gate electrode 42 is formed below part of finger 45 of gate wiring 43.

Source region 21 and drift layer 83 are formed to extend to the proximity of a portion immediately beneath finger 45 of gate electrode 42.

Also in MOSFET 81 having the configuration above, base 44 of gate wiring 43 is arranged between base 24 of source wiring 23 and drain wiring 33, and base 44 of gate wiring 43 and fingers 25 of source wiring 23 intersect with each other. For this reason, as in RESURF-JFET 1 of the first embodiment, a time lag in gate voltage change is smaller, and time required for charging/discharging a gate circuit is shortened, and therefore, an improved switching speed of MOSFET 81 can be achieved. Furthermore, occurrence of an operationally defective transistor product can be suppressed.

A method for manufacturing MOSFET 81 shown in FIG. 12 is basically the same as the method for manufacturing RESURF-JFET 1 of the first embodiment basically shown in FIG. 8, however, different in the step of forming drift layer 83 and the step of forming gate electrode 42. Specifically, steps (S10) to (S20) shown in FIG. 8 are carried out. Subsequently, on buffer layer 11, body layer 82 is formed (S30). Body layer 82 may have a thickness of 0.6 μm, for example.

At surface 82a of body layer 82, source region 21 and drain region 31 which include a second conductivity type (n type) impurity are then formed (S60). This is followed by forming, at surface 82a of body layer 82, drift layer 83 including a second conductivity type (n type) impurity. Subsequently, activation annealing for activating ions implanted into drift layer 83, source region 21 and drain region 31 is performed (S70). Surface 82a of body layer 82 is then thermally oxidized to form field oxide film 20 (S80).

Openings are then formed in predetermined regions of field oxide film 20 corresponding to positions where source electrode 22 and drain electrode 32 are to be formed in a subsequent step (S90). This is followed by forming ohmic electrodes within the openings and simultaneously forming an ohmic electrode corresponding to gate electrode 42 also on field oxide film 20 (S100). In this way, source electrode 22 in contact with source region 21, drain electrode 32 in contact with drain region 31, and gate electrode 42 on field oxide film 20 are formed. Subsequently, steps (S110) to (S150) are performed. In this way, MOSFET 81 shown in FIG. 12 can be obtained.

Sixth Embodiment

Figure 13:
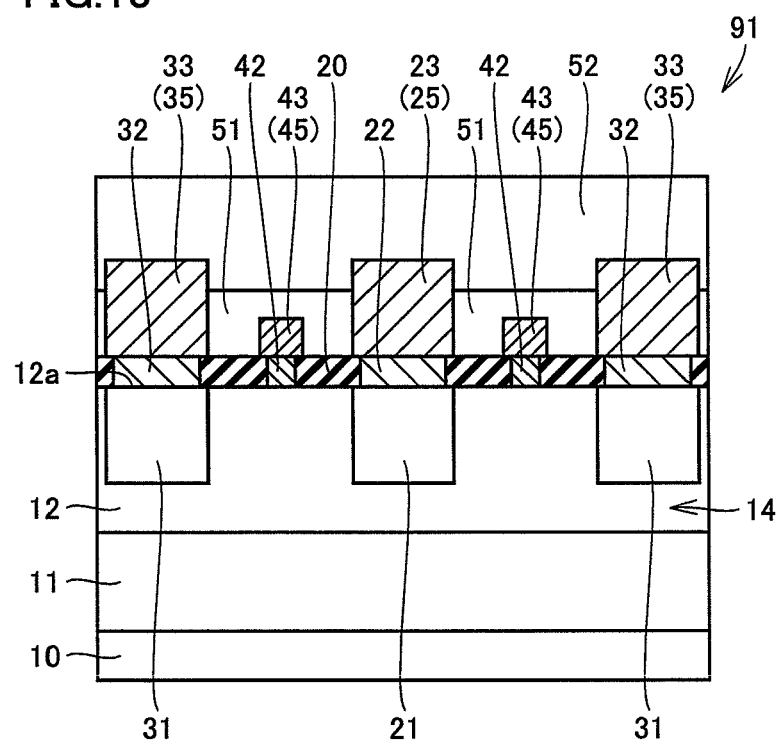
FIG. 13 is a cross-sectional view of a lateral field-effect transistor of a sixth embodiment.

FIG. 13 is a cross-sectional view of a lateral field-effect transistor of a sixth embodiment. The lateral MESFET (MEtal-Semiconductor Field Effect Transistor) 91 shown in FIG. 13 to serve as an example of the lateral field-effect transistor has the same basic configuration as that of RESURF-JFET 1 of the first embodiment. MESFET 91 is, however, different from RESURF-JFET 1 in having a structure in which Schottky junction gate electrode 42 is formed on channel layer 12 of the semiconductor.

Specifically, in MESFET 91 shown in FIG. 13, active layer 14 includes p− type buffer layer 11 formed on substrate 10 and n type channel layer 12 formed on buffer layer 11. Channel layer 12 has surface 12a. From surface 12a of channel layer 12 to the interior of channel layer 12, n+ type source region 21 and n+ type drain region 31 are formed. In field oxide film 20 formed on surface 12a to serve as an upper surface of channel layer 12, a plurality of openings are formed.

Within the opening located on source region 21, source electrode 22 is formed. Source region 21 is formed to oppose finger 25 of source wiring 23. Source electrode 22 electrically connects finger 25 of source wiring 23 and source region 21.

Within the opening located on drain region 31, drain electrode 32 is formed. Drain region 31 is formed to oppose finger 35 of drain wiring 33. Drain electrode 32 electrically connects finger 35 of drain wiring 33 and drain region 31.

An opening is also formed in field oxide film 20 between source electrode 22 and drain electrode 32, and within this opening, gate electrode 42 is formed. Gate electrode 42 is formed below part of finger 45 of gate wiring 43. Below gate electrode 42, no gate region described in the first embodiment exists. Gate electrode 42 is directly arranged on surface 12a of channel layer 12 and formed to be in contact with channel layer 12 and to exhibit the Schottky characteristics.

Also in MESFET 91 having the configuration above, base 44 of gate wiring 43 is arranged between base 24 of source wiring 23 and drain wiring 33, and base 44 of gate wiring 43 and fingers 25 of source wiring 23 intersect with each other. For this reason, as in RESURF-JFET 1 of the first embodiment, a time lag in gate voltage change is smaller, and time required for charging/discharging a gate circuit is shortened, and therefore, an improved switching speed of MESFET 91 can be achieved. Furthermore, occurrence of an operationally defective transistor product can be suppressed.

A method for manufacturing MESFET 91 shown in FIG. 13 is basically the same as the method for manufacturing RESURF-JFET 1 of the first embodiment basically shown in FIG. 8, however, different in that step (S40) of forming RESURF layer 13 and step (S50) of forming gate region 41 are not performed. Specifically, steps (S10) to (S30) shown in FIG. 8 are performed. This is followed by forming, at surface 12a of channel layer 12, source region 21 and drain region 31 which include a second conductivity type (n type) impurity (S60).

Activation annealing for activating ions implanted into source region 21 and drain region 31 is then performed (S70). Surface 12a of channel layer 12 is then thermally oxidized to form field oxide film 20 (S80). Subsequently, steps (S90) to (S150) are performed. In this way, MESFET 91 shown in FIG. 13 can be obtained.

It is noted that in describing the first to sixth embodiments, descriptions are given of examples of a lateral field-effect transistor where p type is a first conductivity type and n type is a second conductivity type, however, as to the conductivity type of each component of the lateral field-effect transistor, p type and n type may all be reversed.

Though embodiments according to the present invention have been described above, it should be understood that the embodiments disclosed herein are illustrative and non-restrictive in every respect. The scope of the present invention is defined by the terms of the claims, not by the above description, and is intended to include any modifications within the scope and meaning equivalent to the terms of the claims.

REFERENCE SIGNS LIST

1 RESURF-JFET; 10 substrate; 11 buffer layer; 12 channel layer; 12a, 13a, 82a surface; 13 RESURF layer; 14 active layer; 20 field oxide film; 21 source region; 22 source electrode; 23 source wiring; 24, 34, 44 base; 25, 35, 45 finger; 31 drain region; 32 drain electrode; 33 drain wiring; 41 gate region; 42 gate electrode; 43 gate wiring; 46 tip; 47 connection; 49 gate pad; 51 interlayer insulating film; 52 passivation film; 61 base region; 62 base electrode; 82 body layer; 83 drift layer; 101 first wiring; 102 second wiring.

The invention claimed is:
1. A field effect transistor comprising:
a substrate;
an active layer formed on said substrate; and a source wiring, a drain wiring and a gate wiring formed above said active layer, said source wiring being formed in a comb shape having a source wiring base and a plurality of source wiring fingers protruding from said source wiring base, said drain wiring being formed in a comb shape having a drain wiring base and a plurality of drain wiring fingers protruding from said drain wiring base, said source wiring and said drain wiring being arranged to oppose each other such that said source wiring fingers and said drain wiring fingers interdigitate, said gate wiring having a gate wiring base, a plurality of gate wiring fingers protruding from said gate wiring base, and a connection connecting tips of adjacent said gate wiring fingers, said gate wiring finger being arranged between said source wiring finger and said drain wiring finger, and said gate wiring base being arranged between said source wiring base and said drain wiring fingers and intersecting with said source wiring fingers, with an insulating film interposed between said gate wiring base and said source wiring fingers, wherein adjacent said gate wiring fingers and said connection connecting said gate wiring fingers make up a first wiring, a section of said gate wiring base between two points where adjacent said gate wiring fingers connected by said connection are connected to said gate wiring base, respectively, makes up a second wiring which is electrically parallel with said first wiring, and said first wiring has an electrical resistance not less than an electrical resistance of said second wiring.

2. The field effect transistor according to claim 1, wherein said gate wiring finger has a vertical cross-sectional area not more than a vertical cross-sectional area of said gate wiring base.

3. The field effect transistor according to claim 1, wherein said active layer includes:

a first conductivity type buffer layer;

a second conductivity type channel layer formed on said buffer layer and having a surface;

a second conductivity type source region formed from said surface of said channel layer opposing at least part of said source wiring finger to an interior of said channel layer;

a second conductivity type drain region formed from said surface of said channel layer opposing at least part of said drain wiring finger to said interior of said channel layer; and a first conductivity type gate region formed from said surface of said channel layer opposing at least part of said gate wiring finger to said interior of said channel layer, the field effect transistor further comprises:

a source electrode connecting said source wiring finger and said source region;

a drain electrode connecting said drain wiring finger and said drain region; and a gate electrode connecting said gate wiring finger and said gate region.

4. The field effect transistor according to claim 3, further comprising:

a first conductivity type base region formed below at least part of said source wiring finger and extending from said surface to said buffer layer; and a base electrode connecting said source wiring finger and said base region.

5. The field effect transistor according to claim 4, wherein said base region is surrounded by said source region when said field effect transistor is seen in plan view.

6. The field effect transistor according to claim 4, wherein said base electrode is provided below said source electrode.

7. The field effect transistor according to claim 1, wherein said active layer includes:

a first conductivity type buffer layer;

a second conductivity type channel layer formed on said buffer layer;

a first conductivity type RESURF layer formed on said channel layer and having a surface;

a second conductivity type source region formed to extend from said surface of said RESURF layer opposing at least part of said source wiring finger to said channel layer;

a second conductivity type drain region formed to extend from said surface of said RESURF layer opposing at least part of said drain wiring finger to said channel layer; and a first conductivity type gate region formed to extend from said surface of said RESURF layer opposing at least part of said gate wiring finger to said channel layer, the field effect transistor further comprises:

a source electrode connecting said source wiring finger and said source region;

a drain electrode connecting said drain wiring finger and said drain region; and a gate electrode connecting said gate wiring finger and said gate region.

8. The field effect transistor according to claim 1, wherein said active layer includes:

a first conductivity type buffer layer;

a first conductivity type body layer formed on said buffer layer and having a surface;

a second conductivity type source region formed from said surface of said body layer opposing at least part of said source wiring finger to an interior of said body layer; and a second conductivity type drain region formed from said surface of said body layer opposing at least part of said drain wiring finger to said interior of said body layer, the field effect transistor further comprises:

a gate electrode formed below at least part of said gate wiring finger and formed on said body layer, with an insulating layer interposed therebetween;

a source electrode connecting said source wiring finger and said source region; and a drain electrode connecting said drain wiring finger and said drain region.

9. The field effect transistor according to claim 1, wherein said active layer includes:

a first conductivity type buffer layer;

a second conductivity type channel layer formed on said buffer layer and having a surface;

a second conductivity type source region formed from said surface of said channel layer opposing at least part of said source wiring finger to an interior of said channel layer; and a second conductivity type drain region formed from said surface of said channel layer opposing at least part of said drain wiring finger to said interior of said channel layer, the field effect transistor further comprises:

a gate electrode formed below at least part of said gate wiring finger, being in contact with said channel layer and exhibiting the Schottky characteristics;

a source electrode connecting said source wiring finger and said source region; and a drain electrode connecting said drain wiring finger and said drain region.

\* \* \* \* \*